(12) United States Patent  
Dattilo et al.

(10) Patent No.: US 11,358,172 B2  
(45) Date of Patent: Jun. 14, 2022

(54) METHOD FOR TREATING SUBSTRATES WITH AN AQUEOUS LIQUID MEDIUM EXPOSED TO UV-RADIATION

(71) Applicant: SUSS MICROTEC PHOTOMASK EQUIPMENT GMBH & CO. KG, Sternenfels (DE)

(72) Inventors: Davide Dattilo, Bretten (DE); Uwe Dietze, Austin, TX (US); SherJang Singh, Clifton Park, NY (US)

(73) Assignee: SUSS MICROTEC PHOTOMASK EQUIPMENT GMBH & CO. KG, Sternenfels (DE)

( * ) Notice: Subject to any disclaimer, the term of this patent is extended or adjusted under 35 U.S.C. 154(b) by 400 days.

(21) Appl. No.: 14/863,523

(22) Filed: Sep. 24, 2015

(65) Prior Publication Data

US 2017/0087585 A1 Mar. 30, 2017

(51) Int. Cl.
*B08B 3/10* (2006.01)
*G03F 1/82* (2012.01)
(Continued)

(52) U.S. Cl.
CPC ............... *B05D 3/002* (2013.01); *B05B 1/00* (2013.01); *B08B 3/10* (2013.01); *B08B 7/0057* (2013.01);
(Continued)

(58) Field of Classification Search
None
See application file for complete search history.

(56) References Cited

U.S. PATENT DOCUMENTS

2003/0205240 A1  11/2003  Bergman
2005/0078286 A1  4/2005   Dierichs et al.
(Continued)

FOREIGN PATENT DOCUMENTS

DE  102009058962       5/2011
JP  2004241726         8/2004
JP  2004241726  A  *  8/2004

*Primary Examiner* — Nicole Blan
(74) *Attorney, Agent, or Firm* — Tarolli, Sundheim, Covell & Tummino LLP (57) ABSTRACT

Methods for treating substrates are described. The methods comprise the steps of flowing an aqueous liquid medium through a flow channel and at least one outlet slit onto a substrate to be treated and exposing the aqueous liquid medium to UV-radiation of a specific wavelength at least in a portion of the flow channel immediately adjacent the at least one outlet slit and after the aqueous liquid medium has flown through the outlet opening towards the substrate and thus prior to and while applying the aqueous liquid medium to the surface of the substrate to be treated. In one method, the electrical conductance of the aqueous liquid medium is adjusted to be in the range of 20 to 2000 µS, by the addition of an additive to the aqueous liquid medium, the aqueous liquid medium prior to the addition of the additive having an electrical conductivity below 20 µS, prior to or while exposing the same to the UV-radiation. Additionally, the pH of the aqueous liquid medium may be adjusted to a range of 8 to 11 or 3 to 6 prior to or while exposing the same to the UV-radiation. The adjustments may lead to a shift in an equilibrium of reactive species generated in the aqueous liquid medium by the UV-radiation towards preferred species.

22 Claims, 8 Drawing Sheets

(51) Int. Cl.
  *B08B 7/00*    (2006.01)
  *C11D 11/00*   (2006.01)
  *C11D 3/30*    (2006.01)
  *B05D 3/00*    (2006.01)
  *B05B 1/00*    (2006.01)
  *H01L 21/67*   (2006.01)
  *G03F 7/20*    (2006.01)
  *G03F 7/42*    (2006.01)
  *H01L 21/311*  (2006.01)

(52) U.S. Cl.
  CPC .............. *C11D 11/007* (2013.01); *G03F 1/82* (2013.01); *G03F 7/42* (2013.01); *G03F 7/423* (2013.01); *G03F 7/425* (2013.01); *G03F 7/70925* (2013.01); *H01L 21/6708* (2013.01); *H01L 21/67051* (2013.01); *H01L 21/67115* (2013.01); *B05D 2203/30* (2013.01); *C11D 3/30* (2013.01); *C11D 11/0047* (2013.01); *H01L 21/31138* (2013.01)

(56) References Cited

U.S. PATENT DOCUMENTS

| | | | |
|---|---|---|---|
| 2005/0133067 A1* | 6/2005 | Bergman | B08B 3/00 134/26 |
| 2005/0229946 A1* | 10/2005 | Hirae | B08B 3/08 134/1 |
| 2007/0127001 A1 | 6/2007 | Van Der Hoeven | |
| 2008/0113518 A1* | 5/2008 | Kume | H01L 21/31111 438/746 |
| 2011/0036145 A1* | 2/2011 | Dobbyn | B08B 15/023 73/31.05 |
| 2012/0211024 A1* | 8/2012 | Dietze | B08B 3/10 134/1.3 |
| 2013/0327353 A1* | 12/2013 | Field | A47L 11/4083 134/1 |
| 2014/0261546 A1* | 9/2014 | Erickson | C11D 3/0052 134/8 |

* cited by examiner

METHOD FOR TREATING SUBSTRATES WITH AN AQUEOUS LIQUID MEDIUM EXPOSED TO UV-RADIATION

TECHNICAL FIELD

The present invention relates to methods for treating substrates, with an aqueous liquid medium exposed to UV-radiation.

BACKGROUND ART

In the field of manufacturing semiconductors, several processing steps are performed on a semiconductor substrate, typically called a wafer. One of these steps includes photolithography, in which a photomask is used to expose a photoresist on a wafer to a pattern of intense light. The exposure to light causes a chemical change that allows some of the photoresist to be removed by a special solution, in accordance with the pattern.

In the field of manufacturing semiconductors and in particular in photolithography it is important that ail components, such as for example the wafer and the photomask are very clean and preferably do not have foreign particles thereon. Such requirements are also present in other technologies, where a surface preparation and/or the removal of contaminants, in particular organic contaminants such as a resist are important and therefore, even though specific reference is made to substrates such as photomasks used in photolithography, the invention is also applicable for other substrates such as semiconductor substrates, wafers, imprint templates, panels, in particular flat panel substrates and multi layer ceramic substrates.

Although the present application will focus mainly on the treatment of photomasks as a substrate to perform a treatment on, the principles described herein are also transferable to the wafer itself or other substrates, as pointed out above.

Different methods have been used in the past for removing of photoresist from a photomask. One such method as described in DE 10 2009 058 962 A1, which is assigned to the assignee of the present invention, uses an aqueous medium which is exposed to UV-radiation immediately prior to and while applying a film of said aqueous liquid medium to the surface of the substrate to be treated.

Such a removal process may be divided into several individual steps such as a surface preparation, a strip, end a final clean. In the surface preparations the surface energy may be adjusted to for example achieve a hydrophilic surface. In the strip, a main portion of the photoresist is removed by radicals generated in the aqueous liquid medium. In the final clean, remaining resist and other particles are removed. In the final clean, care has to be taken not to change such as etch the surface of the substrate itself, but to remove the particles without changing the surface of the substrate. It should be noted that depending on the type of treatment and for example the initial surface condition, not all of the steps of the above sequence have to be used. For example, a surface preparation is not always necessary, in particular if the surface is sufficiently hydrophilic when entering a process. Also, a new mask not having a resist thereon or a mask coming out of a storage space, which had been stripped some time ago, will not need a strip but only a final clean (optionally preceded by a surface preparation). Depending on the application, only a strip (optionally preceded by a surface preparation) is necessary.

The disclosure in DE 10 2009 058 062 A1 already indicates these steps and describes a single tool which may be used for all steps with changing media and/or radiation. The disclosure, however, does not give specific details with respect to the composition of the aqueous liquid media used in the individual steps.

The inventors of the present invention have now found that certain parameters of the media used in the specific steps may benefit the respective process.

SUMMARY OF THE INVENTION

In accordance with the invention, a method as set forth in claim 1 or 8 is provided. Further embodiments are inter alia disclosed in the dependent claims.

In accordance with one aspect, a method for treating substrates, comprises flowing an aqueous liquid medium through a flow channel and at least one outlet slit onto a substrate to be treated, and exposing the aqueous liquid medium to UV-radiation of a specific wavelength at least in a portion of the flow channel immediately adjacent the at least one outlet slit and after the aqueous liquid medium has flown through the outlet opening towards the substrate and thus prior to and while applying the aqueous liquid medium to the surface of the substrate to be treated. The method further comprises the step of adjusting the electrical conductance of the aqueous liquid medium to be in the range of 20 to 2000 $\mu S$, by the addition of an additive to the aqueous liquid medium, prior to or while exposing the same to the UV-radiation, wherein prior to the addition of the additive the aqueous liquid medium has electrical conductance below 20 $\mu S$. Adjusting the electrical conductance influences the equilibrium of reactive species generated in the aqueous liquid medium by the UV-radiation, and thus the equilibrium may be shifted towards preferred species. In particular, the equilibrium may be shifted such that at the time the aqueous liquid medium flows through the outlet slits, a certain concentration/ratio of reactive species is present.

In one application, the additive is an additive, which does net substantially change the pH of the aqueous liquid medium, wherein the term not substantially is supposed to cause a pH shift of less than 0.5. Non-limiting examples of such additives which may be used are salts such as Sodium chloride or potassium chloride.

In another application, the method further comprises shifting the pH of the aqueous liquid medium to a range of 8 to 11 or 3 to 6 by the addition of the additive, wherein the aqueous liquid medium prior to the addition of the additive has a pH in the range of 6 to 8, and wherein the additive comprises a base or an acid. The shift in the pH also influences an equilibrium of reactive species, and thus a shift of the equilibrium of reactive species generated in the aqueous liquid medium by the UV-radiation towards preferred species may be achieved. Such a shift in the pH may speed up or slow down certain reactions within the liquid medium caused by the UV-radiation and may thus shift an equilibrium of reacted species in the aqueous liquid medium. In particular, the equilibrium may be shifted such that at the time the aqueous liquid medium flows through the outlet slits, a certain concentration/ratio of reactive species is present. As an example, in ozone water first hydroxyl radicals are produced and then further species, such as O⁻ with less oxidation strength and same capability for organic removal. Alkaline pH extends lifetime of radicals in aqueous liquid medium thereby a shift/stabilization of the equilibrium of species may be achieved. Furthermore, an alkaline medium changes the electrical potential of a metal surface which is thus less sensitive to oxidation. An acidic medium for example stows down decomposition of Ozone while an alkaline medium speeds up decomposition of Ozone and thus the generation of further species. The invention thus enables an adjustment of the concentration/ratio of species at the outlet slit by shifting the pH of the liquid medium. The process may thus be tailored to the specific application and requirement.

The aqueous liquid medium may in particular be adjusted to have a pH-value in the range of 8 to 11 and electrical conductance in the range of 20 to 500 µS, wherein the additive comprises a base. The media electrical conductance indicates an advantageous low concentration of the base. Only by mixing the medium prior to inserting it into the flew channel such low concentrations may be used to achieve the desired effect.

In accordance with another aspect of the invention, the aqueous liquid medium is adjusted to have a pH-value in the range of 9.5 to 10.5 and electrical conductance in the range of 70 to 150 µS. When using a base to shift the pH, a preferred material is TMAH, which even at low concentrations may achieve the required shift and is furthermore a non-coordinating compound.

The base is preferably a non-coordinating compound, which does not have available external electrons capable of establishing a direct bond with a metal on the surface of the substrate, such as for example Tetramethylammonium Hydroxide (TMAH) or Potassium Hydroxide (KOH). The aqueous base medium preferably comprises DI-Water.

In accordance with one aspect, the aqueous liquid medium is a mixture of an aqueous liquid medium, which is in substance a non-absorbing medium for the UV-radiation at the specific wavelength, and 5 to 100 ppm of a substantially absorbing medium at the specific wavelength. Thus only a small amount of the overall medium is absorbing the UV-radiation at the specific wavelength, thereby enabling good adjustment of the amount of reactive species. The substantially absorbing medium may be the additive for adjusting the electrical conductance, but it is also possible that the absorbing medium is a different medium.

In one application, the method relates to a final clean of a substrate having an exposed metal layer, such as a EUV mask. Such a final clean may for example be performed after a photoresist strip.

The method may further comprise the step of adjusting the time the liquid medium is exposed to the UV-radiation in the flow channel before exiting the at least one outlet slit, which may further enable the equilibrium of species to be shifted. In this context, at least one of the electrical conductance and the pH may be adjusted in accordance with the amount of time the aqueous liquid medium is exposed to the UV-radiation within the flow channel before exiting the at least one outlet slit.

The above methods may further comprise the step of exposing the aqueous liquid medium to UV-radiator of a specific other wavelength as used in the step of exposing the aqueous liquid medium to UV-radiation of a specific wavelength immediately prior to and while applying a film of said aqueous liquid medium to the surface of the substrate to be treated, prior to said step. This may for enable prepare the aqueous liquid for specific radical generation and may further allow decomposing certain components in the liquid which are not supposed to reach the substrate, such as $O_3$.

The aqueous liquid medium may be adjusted to have an electrical conductance in the range of 70 to 150 µS and may also be adjusted to have a temperature in the range of 20 to 70° C., in particular in the range of 20 to 40° C.

In accordance with a preferred embodiment the aqueous liquid medium is irradiated with UV-radiation at an intensity of 25 to 340 mW/cm². The distance of a source of UV-radiation and the surface of the substrate to be treated may be adjusted to be in the range of 1 to 5 mm, in particular 1 to 2 mm. The aqueous liquid medium may be exposed to UV-radiation of a wavelength in the range of 185 to 600 nm, in particular 185 to 300 nm. In the step of exposing the aqueous liquid medium to UV-radiation of a specific wavelength immediately prior to and while applying a film of said aqueous liquid medium to the surface of the substrate to be treated, the specific wavelength is preferably in the range of 200 to 300 nm, preferably at about 254 nm for generating radicals. The specific other wavelength may be below 200 nm, preferably at about 185 nm, which may be better suited for preparation/decomposing the liquid.

The method may specifically relate to a photo-resist strip from the substrate, wherein the composition of the aqueous liquid medium is adjusted to have an electrical conductance in the range of 20 to 500 µS, in particular in the range of 70 to 150 µS, and wherein the aqueous liquid medium is a mixture of an aqueous liquid medium, which is in substance a non-absorbing medium for the UV-radiation at the specific wavelength, and 5 to 100 ppm of a substantially absorbing medium at the specific wavelength. In this application, the at least one absorbing medium may for example be selected from the group comprising $O_3$, $H_2O_2$ and TMAH.

The method may in one instance relate to an adjustment of the surface energy of the substrate, wherein the composition of the aqueous liquid medium is adjusted to have an electrical conductance in the range of 70 to 150 µS, and wherein the aqueous liquid medium is a mixture of an aqueous liquid medium, which is in substance a non-absorbing medium for the UV-radiation at the specific wavelength, and 5 to 10 ppm of a substantially absorbing medium at the specific wavelength The steps of the method may be repeated several times on the same substrate to achieve a desired effect, wherein different absorbing media may be used in different repeat cycles. Preferably, at least one absorbing medium is selected from $O_3$ and TMAH.

The method may specifically relate to a photo-resist strip from the substrate, wherein the composition of the aqueous liquid medium is adjusted to have an electrical conductance in the range of 20 to 500 µS, in particular in the range of 70 to 150 µS, and wherein the aqueous liquid medium is a mixture of an aqueous liquid medium, which is in substance a non-absorbing medium for the UV-radiation at the specific wavelength, and 5 to 100 ppm of a substantially absorbing medium at the specific wavelength. In this application, the at least one absorbing medium may for example be selected from the group comprising $O_3$, $H_2O_2$ and TMAH.

In one application at least two of the above methods related to the adjustment of the surface energy, photo-resist strip and final clean are performed in the above order.

BRIEF DESCRIPTION OF THE DRAWINGS

The invention will be explained in more detail herein below with reference to the drawings. In the drawings.

DETAILED DESCRIPTION OF THE EMBODIMENTS

Any directional references used in the following description, such as above, below, left or right refers to the drawings and are not to be construed as limiting the application, even though they may refer to a preferred arrangement. Although the present invention is directed to a method, an exemplary apparatus for performing such method will initially be described. The apparatus and method will be described in combination with a photomask, in particular an EUV mask, but principles of the invention may also be applied to other substrates, in particular to semiconductor substrates during the processing thereof, wafers, imprint templates, panels, in particular flat panel substrates and multi layer ceramic substrates.

Figure 1:
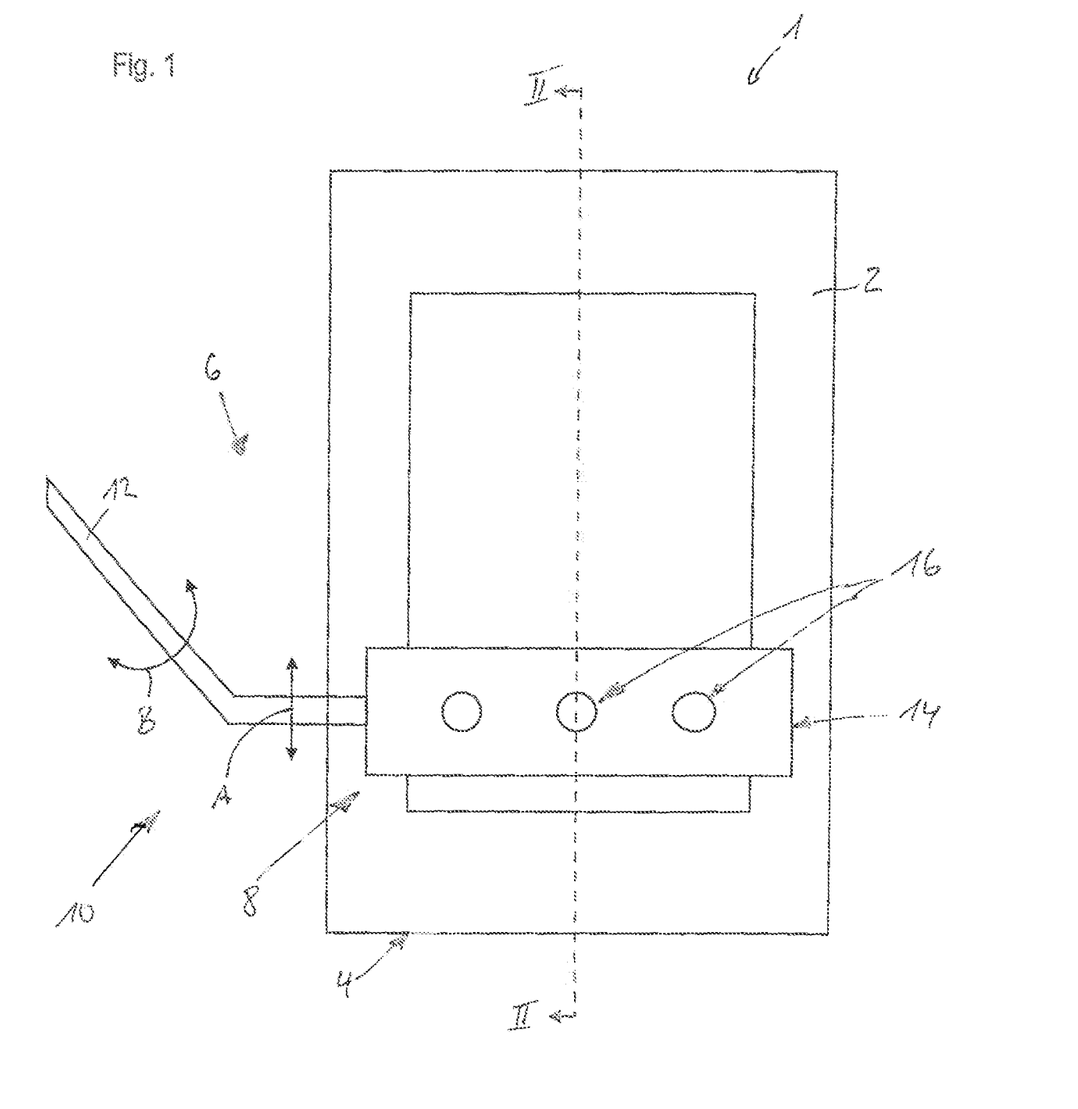
FIG. 1 is a schematic top view of a treatment apparatus which may be used in the method of the present invention.
Figure 2:
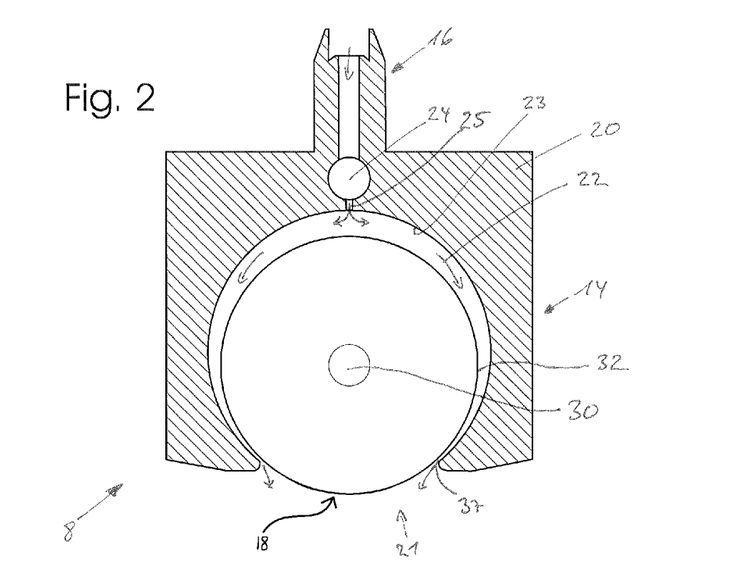
FIG. 2 is a schematic sectional view of the apparatus of FIG. 1 along line I-I.

FIG. 1 shows a schematic top view onto an apparatus 1 for treating substrates 2, while FIG. 2 shows a schematic sectional view of the apparatus 1 along the line I-I.

The apparatus 1 basically consists of a receiver for the substrate, which will be called a substrate holder for an application unit 6. The substrate holder 4 and the application unit 6 may be arranged in a pressure chamber, which is not shown, in which a positive pressure or a negative pressure may be generated by appropriate means.

The substrate holder 4 is, as may be seen in the drawings, a flat rectangular plate for receiving the also rectangular substrate 2. The substrate holder 4 may have other shapes, which may be matched to the shape of the substrate 2 to be treated. The substrate holder 4 has a drainage, which is not shown, for liquids, which may be applied via the application unit 6 onto the substrate 2.

The application unit 6 consists of a main part 8 and a support part 10, which supports the main part 8 in a movable manner, as is shown by the double-headed arrows A and B. In particular, the support part 10 has a support arm 12, which is connected on one and to the main part 8. The other end of the support arm 12 is connected to a drive mechanism, which is not shown. As is shown by the double-headed arrows A and B, the drive mechanism may for example provide a pivotal movement of the support arm 10 and thus the main part 8 and/or a linear movement. In this manner, the main part 8 may be moved across a substrate 2, which is received on said substrate holder 4, in order to enable treatment of partial areas or the complete surface of the substrate 2. Furthermore, it is also possible that the support arm 10 provides a lift movement in order to adjust a distance between the main part 3 and the surface of a substrate 2 received on the substrate holder 4.

Alternatively, or additionally it is also possible to provide a moving mechanism for the substrate holder, in order to provide relative movement between the substrate 2 and the main part 8.

The main part 3 has a housing 14, liquid ports 16 and a radiation source 18. The housing 14 has an elongated cuboid shaped body 20, which defines in its longitudinal extension a flow chamber 22, which in substance extends across the complete lengths of the body 20. The flow chamber 22 has a lengthwise extension, which is larger than a width extension of the substrate 2, in order to be able to apply a liquid to the substrate across the complete width thereof, as will be explained in more detail herein below. It is, however, also possible that the flow chamber has a smaller dimension. An inner surface 23 of the flow chamber 22 may be designed to have a high reflectivity in particular with respect to UV radiation, while IR radiation may be substantially absorbed.

The flow chamber 22 has a substantially round cross-sectional shape. The flow chamber 22 is open towards the bottom side of the body 20, such that the body defines an outlet opening 21 directed towards the substrate 2 to be treated. In an upper portion of the flow chamber 22, a conduit 24 is provided in the body 20, which extends in substance parallel to the flow chamber 22. The conduit 24 is fluidly connected to the liquid ports 16. The conduit 24 is also fluidly connected to the flow chamber 22, via a plurality of conduits or bores 25 at a plurality of locations. It is thus possible to conduct fluids into the flow chamber 22 via the liquid ports 16, the conduit 24 and the plurality of conduits 25. In this respect it is noted that the conduit 24 in combination with the conduits 25 is capable of conducting fluids into the flow chamber 22 substantially over the complete length thereof.

The liquid ports 16 are each connected to an external conduit not shown, via which one or more fluids may be conducted to the liquid ports 16. It is possible, that a plurality of fluids may be simultaneously or sequentially conducted to the liquid port via this external conduit, it is also possible to provide a plurality of external conduits, via which e.g. different fluids may be conducted to the liquid port. As fluids, e.g. liquids may be taken into consideration, but it is also possible to conduct gases to the liquid ports 16, which may e.g. be mixed with a liquid in the liquid ports 16 and the conduit 24, before they are conducted to the flow chamber 22. In FIG. 2 arrows are shown, which indicate the flow of a liquid from the liquid ports 16 via the conduit 24, into the flow chamber 22 and out of the housing 14. Although three liquid ports 16 are shown, it should be noted that more or less liquid ports 16 may be provided and that they may connect the same or different fluid sources to the conduit 24. Selected liquid ports 16 may also directly be connected to the flow chamber 22 or indirectly via a second conduit (not shown), similar to conduit 24. Such arrangements may enable different possibilities of bringing different fluids into the flow chamber 22, as the skilled person will realize. In particular, such arrangements allow mixing different fluids prior to injecting them into the flow chamber 22, either upstream of the liquid port(s) 16 or downstream thereof in the conduit 24. Another possibility is to bring the different fluids separately via separate liquid ports 16 (and optionally separate conduits 24) into the flow chamber 22, such that they are admixed within the flow chamber 22.

The radiation source 18 has a longitudinally extending shape and extends along the complete flow chamber 22, substantially in the middle thereof. The radiation source 18 has a rod shaped lamp 30, which is surrounded by a cover 32, which is substantially transparent to the radiation of a lamp 30. The rod shaped lamp is of the type, which emits at least UV radiation in a predetermined range of wave lengths. It is also possible that the rod shaped lamp 30 emits radiation across a broad spectrum of wave lengths and in particular emits UV radiation and IR radiation.

The cover 32, which may consist for example of quartz glass surrounds the rod shaped lamp 30 completely within the flow chamber 22 and isolates the same with respect to fluids in the flow chamber 22. The cover 32 may for example extend through an end wall of the flow chamber 22 out of the body 20. This would enable access to the rod shaped lamp 30, for example for replacement or maintenance purposes, without having to access the flow chamber 22. Due to its arrangement in the flow chamber 22, the cover 32 together with the inner walls of the flow chamber 22 form a flow path for fluids conducted info the flew chamber 22 via the conduit 24 or a separate inlet (not shown). The flow path is split into two branches (left and right in FIG. 2) and at the outlet opening 21 of the body 20, outlet slits 37 are formed between the body 20 and the cover 32. The middle of the cover 32 is offset downwards with respect to the middle of the flow chamber 22, such that the branches of the flow path are narrowing towards the outlet slits 37. Such a narrowing intends to achieve a homogenization of a fluid flow in the flow chamber 22.

Such fluids flow around the cover 32 and thus as a whole around the radiation source 18. Radiation emitted by the rod shaped lamp 30 is thus introduced into any liquid flowing along the flow path. Furthermore, the cover 32 extends beyond the bottom surface of the body 20 and partially extends into and beyond the outlet opening 21 of the body 20. Thus it is possible that radiation emitted from the rod shaped lamp also exits the flow chamber 22 towards the substrate holder 4 or onto a substrate 2 placed thereon. In particular, the radiation may be introduced into a liquid film on the substrate 2, which is for example formed by a liquid, which flows through the flow chamber 22 and out of the outlet slits 37 onto the substrate. Although not shown, a partial cover may be provided for example on or in the cover 32 to shade certain regions of the flow chamber 22, with respect to UV radiation. In particular an entrance region for the liquid into the flow path may be shaded as the flow here may be turbulent and thus irradiation of the liquid may not be homogeneous or UV radiation may not yet be desired. Such a shading cover may be provided stationary or may be provided moveable, such that the shading of the flow channel may be changed. For Example, moveable shutters may be provided which in a first position let UV-radiation pass and in a second position block the UV-radiation. By providing such shading, the time of exposure to UV-radiation of fluid flowing though the flow channel may be adjusted. Such time may for example also at least partially be adjusted via the flow velocity of the fluid flowing through the flow channel.

Figure 3:
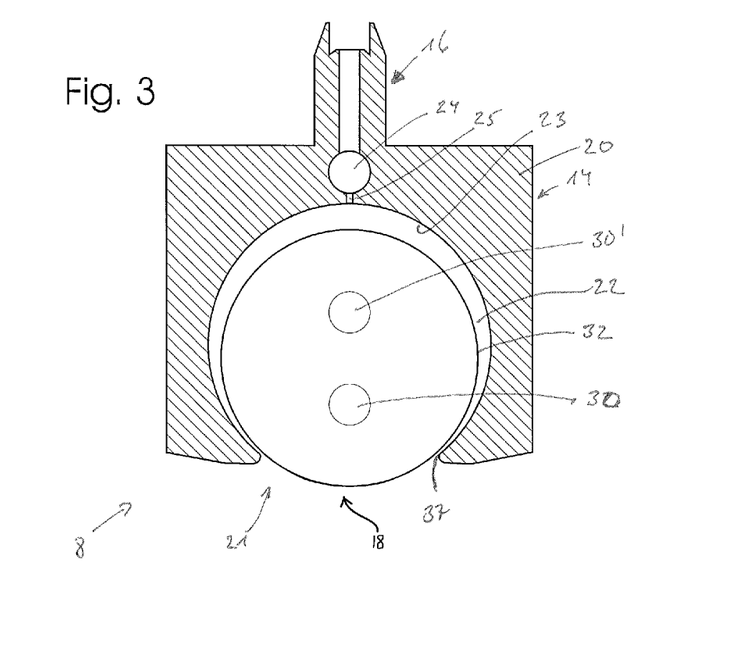
FIG. 3 is a schematic sectional view similar to FIG. 2 according to an alternative embodiment of the apparatus.

FIG. 3 shows a schematic side view similar to FIG. 2 of an alternative embodiment of the apparatus 1 for treating substrates 2. When describing this embodiment, the same reference signs are used as previously inasmuch as the same or similar elements are provided.

The apparatus 1 again substantially consists of a substrate holder 4 for receiving a substrate and an application unit 6. The substrate holder may be designed in the same manner as described before with respect to FIGS. 1 and 2.

The application unit 6 again has a main part 8 and a support part, which is not shown in FIG. 3, which may, however, have the same design as previously described with respect to FIGS. 1 and 2. The main part 8 again substantially consists of a housing 14, liquid ports 16 and a radiation source 18, wherein the housing 14 and the liquid ports 16 may have the same design as previously described with respect to FIGS. 1 and 2.

The radiation source 18 again has an elongated shape and extends substantially in the middle through the flow chamber 22. The radiation source 18 in this embodiment has rod shaped lamps 30, 30', which are surrounded by a cover 32, which is substantially transparent to the radiation of the rod shaped lamps 30, 30' and arranged in the same manner as previously described. The rod shaped lamps 30, 30' are shown above each other in FIG. 3, but they may also be arranged in a different manner within the cover 32 or more than two lamps may be provided. The rod shaped lamps may be of the same or of different types, wherein at least one of them emits UV radiation in a predetermined range of wave lengths. In particular, it is possible that both rod shaped lamps 30, 30' emit UV radiation in different ranges of wave lengths. The upper rod shaped lamp 30' may for example at least partially or primarily emit UV radiation in a wave length range below 200 nm, preferably at about 185 nm, while the lower rod shaped lamp 30 at least partially or primarily emits UV radiation in the wave length range of 200 to 300 nm, preferably at about 254 nm. One or both of the rod shaped lamps 30, 30' may also emit an amount of IR radiation or other radiation. Although not shown a radiation guide element, such as a mirror may be placed between the rod shaped lamps, to guide the respective radiation of the lamps, such that the radiation of the upper lamp is primarily emitted into the flow chamber 22 and the radiation of the lower lamp is primarily emitted outside of the housing 14, although also a portion of the radiation of the lower lamp is also emitted into an end region of the flow chamber 22, adjacent to an exit opening thereof.

The cover 32 surrounds the rod shaped lamps 30, 30' completely within the flow chamber 22 and isolates the same with respect to fluids in said flow chamber 22. In this respect, the cover 32 may have the same design as the cover previously described with respect to FIGS. 1 and 2. Furthermore, it is also possible that further rod shaped lamps are received within the cover 32, which may each emit different radiation or also the same radiation. By the arrangement and the choice of rod shaped lamps 30, 30' a desired radiation profile (with respect to emitted wave lengths and spatial distribution thereof) may be generated within the flow chamber 22 and beyond the same via the outlet opening of the body 20. Again, a (partial) cover for shading the flow chamber from UV-radiation may be provided.

In the following, general operation of the apparatus 1 will be described in more detail with respect to the Figures.

Figure 5:
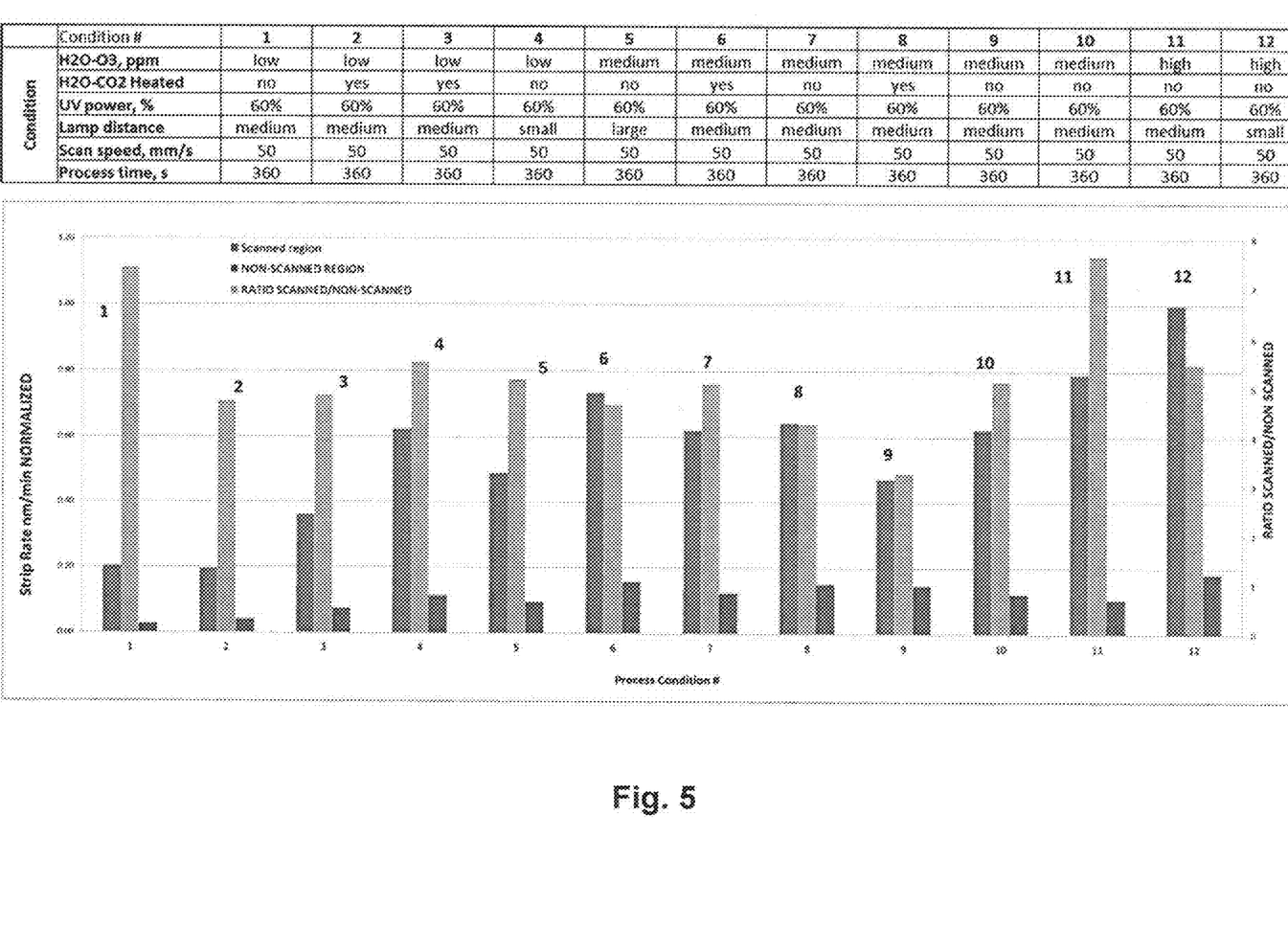
FIG. 5 is a diagram showing a summary of results of strip rates (normalized) for different process parameters.

For the treatment of a surface of the substrate 2, the main part 8 of the application unit 6 will be moved over a substrate 2 on the substrate holder 4. If the complete surface of the substrate should be treated the main part 8 may be moved during the treatment described herein below across the substrate, unless the embodiment according to FIG. 5 is used, which may completely cover the substrate.

Then, a liquid is applied to at least the surfaces of the substrate to be treated via the liquid ports 16, the conduits 24, 25 and the flow chamber 22. Radiation is introduced into said liquid, at least immediately prior to and while applying a film of said liquid to the surface of the substrate to be treated, via the first radiation source 18. The radiation is chosen such that it directly acts on the substrate, in order to treat the same and/or to act on the liquid for changing the characteristics thereof, in order to conduct the desired treatment. In so doing, different treatment possibilities for the surface of the substrate are given, which may be locally limited or may be conducted on the complete surface of the substrate.

In the following, specific examples of such treatments, where the UV-radiation acts on the liquid and in particular with respect to specific compositions of the liquid are explained in more detail. The treatment of an EUV photo mask will be given as an example, abut as pointed out above, similar treatment process may also be performed on other substrates.

Example 1

In this example, the surface energy of the substrate will be adjusted inter alia using a small amount of absorbing medium in an otherwise non-absorbing medium and switching between the same. Previously, as described in DE 10 2009 058 962, an in-situ UV exposure of the substrate through a non-absorbing liquid, such as DI-Water was used to adjust the surface energy, to thereby achieve hydrophilic water contact angle values.

In this example an initial preparation step of an EUV photomask is described. This process step is performed to adjust surface energy for optimal media distribution (surface conditioning); the process step may lead to water contact angles of <10° after treatment.

Surface conditioning is often performed in CO2-water. In the case of 254 nm emission, this is a non-absorbing media. The inventors of the present invention have now found that choosing an absorbing media at low concentration (such as Ozone-water) is leading to a better and faster surface conditioning step, and the introduction of an alkaline media may preserve the surface integrity. Therefore a multi-media approach was designed, which leads to better performances in terms of surface energy adjustment.

Figure 4A:
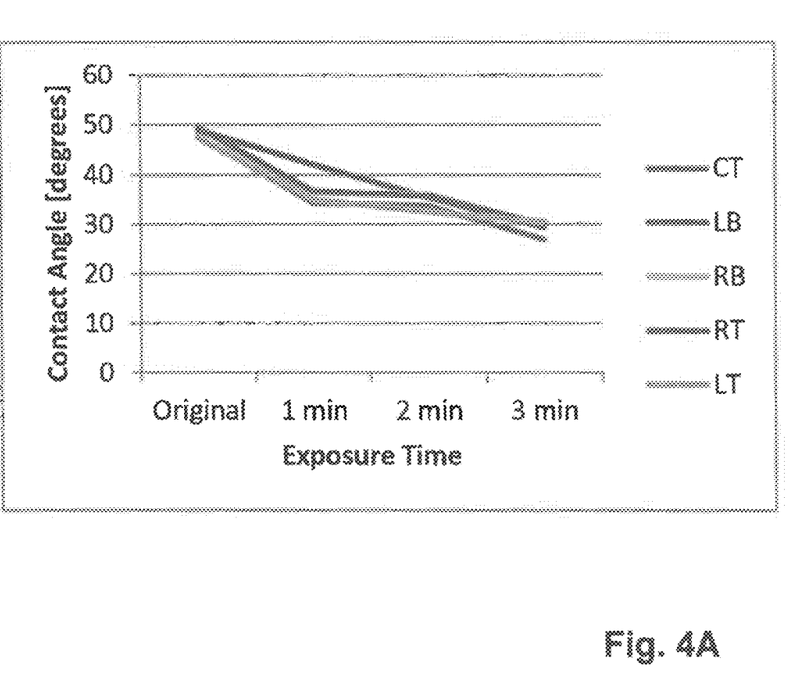
FIGS. 4a and 4b are graphs showing the influence of applying UV radiation to a specific liquid on contact angle values.

Introduction:

As indicated above, in-situ UV exposure can be used to adjust the surface energy to hydrophilic water contact angle values. However, this process step was found to lead to unsatisfactory results when using a 254 nm emitting UV-light source in combination with non-absorbing media (such as DI-$CO_2$ water). FIG. 4a shows how repeated exposure of the surface to DI-$CO_2$ water+UV-light at 254 nm leads to an improvement of contact angle values to about 30°, which however are not satisfactory for all applications. In particular improvement to contact angles of <10° may be desired.

It was found that small additions of an absorbing medium to the otherwise non-absorbing medium lead to better results. In particular, a method was tested, where different absorbing media were alternately used in a treatment. As a first medium TMAH in DI-water at a concentration, which lead to about 150 µS electrical conductance and a pH of 10.2 was selected as an absorbing medium. The low electrical conductance here indicates the low concentration of the TMAH used, which helps to preserve the surface from damage due to caustic nature of this compound (strong base). Secondly $O_3$-DI-water at 20 ppm concentration was selected as an absorbing medium.

Figure 4B:
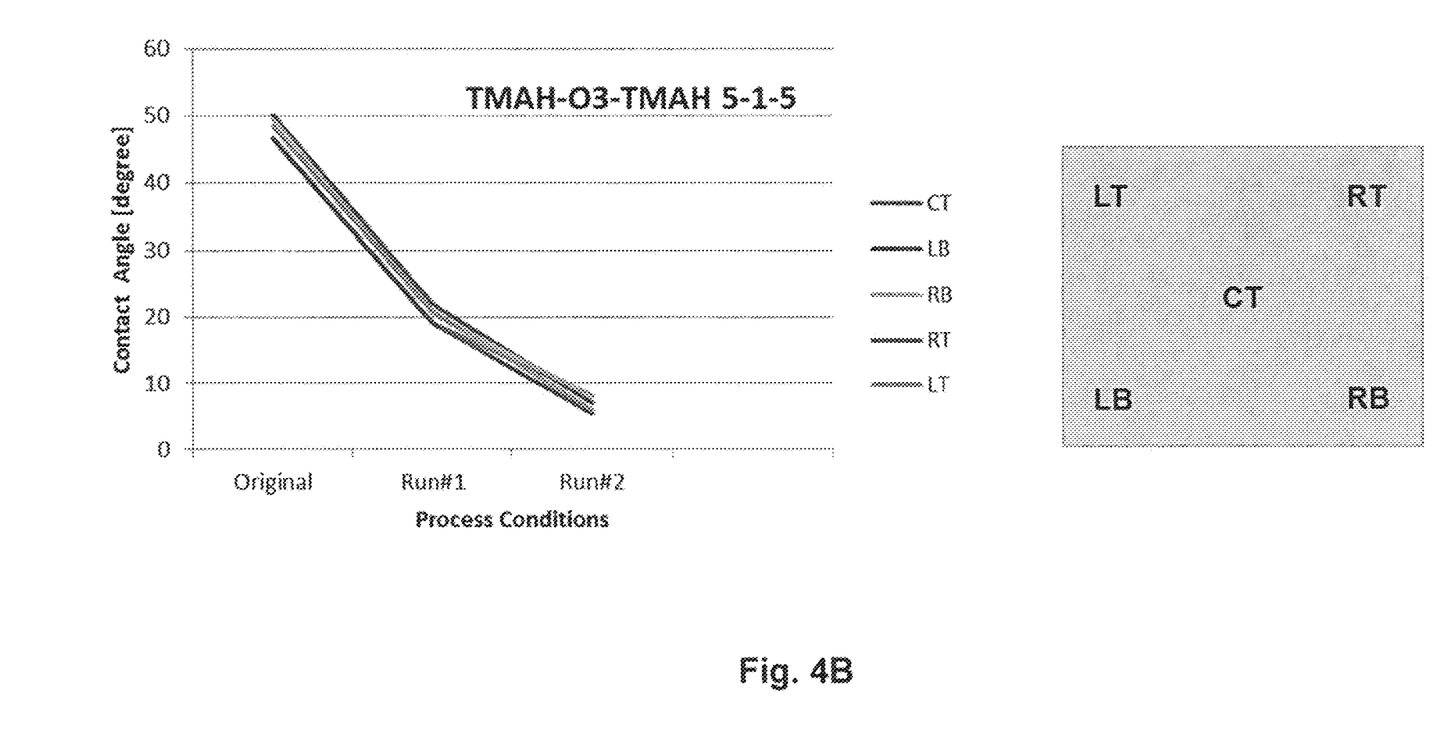

Several oscillations (UV apparatus dispenses the respective medium onto photomask while exposing the same to UV radiation as described above.) were performed for the media. In particular several oscillations (here 5) were performed for Tetramethylammonium Hydroxide TMAH in DI-water, followed by one oscillation of $O_3$-DI-water, and followed by several oscillations for TMAH in DI-water. Several of such cycles may be used as required and as shown in FIG. 4b, after a first cycle (or run) contact angles of <20° were achieved and after a second cycle contact angles of <10° were achieved.

In this case the several media are used, ie, TMAH which is preserving the surface against damage from Ozone or other species generated therefrom and thus a 20 ppm concentration of Ozone can be used.

Switching from a non-absorbing medium to an absorbing medium significantly improved the contact angles. Using the alkaline medium, was considered to beneficial in preserving the surface integrity of the substrate. Although in the example given above, specific media and specific oscillations were described, the skilled person will realize that other absorbing media and other oscillations may be used.

Example 2

Photoresist strip improvement by means of using different absorbing media concentration, and optionally at least one of different distances between light-source and surface and different emission wavelength Introduction:

Photoresist strip has been performed over the past years by means of SPM (Sulphuric Acid+Hydrogen Peroxide mix); despite its decent cleaning capability, this mix has several drawbacks due to high amount of residual ions left on the surface.

SPM resist strip has been replaced by an in-situ UV process such as the one described in above referenced DE 10 2009 058 962. In a typical procedure, an absorbing media is treated with UV-light with generation of photo-products (mostly radicals) which in turn react with the organic layer (resist) on the surface: Used absorbing media can be Ozonated water at different concentrations, solubilized Oxygen or water itself (which is for example absorbing at 185 nm). In the following some of the photolysis processes are given as examples:

The following photolysis processes can be expected when using a UV source emitting at both 185 nm and 254 nm:

Hydroxyl radicals are usually responsible for Organic removal from the surface:

The inventors have run several experiments to demonstrate that strip rates can be adjusted by means of different absorbing media concentrations, by heating one or more media during the process and distance between light-source and substrate. FIG. 5 summarizes the results and conditions used.

In particular, FIG. 5 shows that by adjusting Ozone concentration to high values (60 ppm) leads to good ratio between scanned and non-scanned areas of the mask as well as good strip rates. Adjustment of the distance between light-source and substrate could further improve the performances (conditions 11 and 12).

Figure 6:
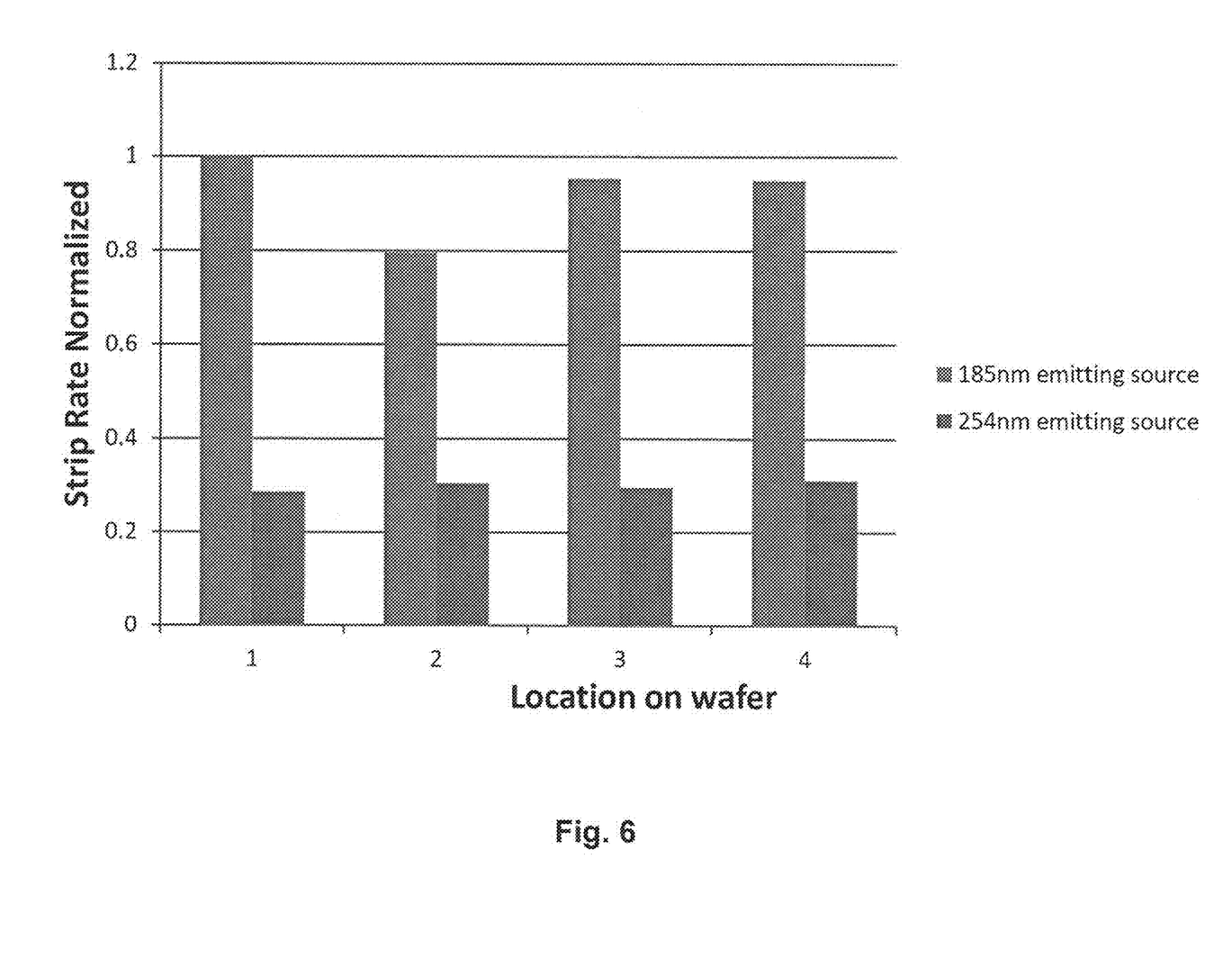
FIG. 6 is a diagram showing a summary of results of strip rates (normalized) for different wavelength.

Emission wavelength also has an impact on the strip rate performances and FIG. 6 shows experimental results upon introduction of 185 nm emitting wavelength into the liquid medium. In particular, FIG. 6 shows that about three times higher strip rates can be achieved in the case of introduction of 185 nm emission wavelength into the liquid medium compared to a 254 nm wavelength.

In this context, the electrical conductance of the medium was found to influence the equilibrium of reactive species generated by the UV radiation. In particular, an increased electrical conductance of at least 20 µS, caused by adding an additive to the liquid medium was found to be beneficial. In the case of using an additive which causes a combination of a pH shift and a shift in the electrical conductance, an electrical conductance in the range of 20 to 500 µS was found to be beneficial. In case of an additive which is in substance neutral with respect to the pH, an even higher electrical conductance up to 2000 µS may be beneficial. Suitable additives which do not substantially alter the pH, i.e. lass than by a value of 0.5 are for example sodium chloride and potassium chloride. Although a lower limit of at least 20 µS is given for the electrical conductance, a lower limit of at least 50 µS, or even at least 70 µS is preferred for most applications.

In this example it is shown how photoresist strip rates can be optimized by changing of the concentration of absorbing medium, change of distance between light-source and substrate and change in the emission wavelength of light-source.

Example 3

Final clean improvements using pH and electrical conductance adjustments in absorbing and non-absorbing media, wherein the pH and electrical conductance adjustments may lead to surface preservation.

In this example we describe improvements in the final clean of EUV photomasks. This process step is usually performed after photoresist strip to eliminate any residual organic (or inorganic) impurities and particles from the photomask surface.

Final clean is often performed in $CO_2$-water. We here show how the shift in pH to alkaline values (>8.5) leads to surface preservation.

Introduction:

The EUV photomask surface is composed by an absorber, usually made by Tantalum Boron Nitride TaBN and a metallic Ruthenium capping layer; the Ruthenium capping layer can be degraded during a wet cleaning step; the major root-causes for this damage are direct or indirect metal oxidation:

Ru (metallic)+UV-light+oxidizing agent===Ru (oxidized)

When Ruthenium is fully oxidized (oxidation state=+8) it forms a volatile compound with resulting peeling off of the metal layer.

Oxidizing agents are usually created upon exposure of water and Oxygen to UV-light:

Oxygen+UV-light: $O_2 \rightarrow O.(1D)+O.(1D)$ $O.(1D)+H_2O \rightarrow HO.+HO.$ Water+Uv-light: $H_2O \rightarrow H.+HO.$ O. and OH. are typical oxidizing agents.

A second root-cause for metal damage is oxygen inter-diffusion into under-laying Mo/Si bilayers, which may lead to silicon dioxide formation, as is for example reported in Y. Jang, A. John, F. Goodwin, S. Y. Lee, S. S. Kim "Understanding the mechanism of capping layer damage and development of a robust capping material for 16 nm HP EUV mask", 2013 International Symposium on Extreme Ultraviolet Lithography, Toyama, Japan 6-10 Oct. 2013. The formation of amorphous silicon dioxide is leading to a volume increase which in turn breaks the metal layer leading to peel-off.

It was found that the electrochemistry shows the following Ruthenium and media properties:

1) The oxidation potential of metallic Ruthenium as well as stable Ruthenium oxides is decreasing with increasing pH.

2) In alkaline environment OH. radicals have lass oxidizing power and more reducing capability; OH. radicals are converted into $O^-$ at alkaline pH; $O^-$ can give similar reactions with hydrocarbons, but has $O^-$ power oxidation strength than OH.

3) In alkaline media, $RuO_4$ is easily reduced into $RuO_4^-$ and $RuO_4^{2-}$

4) $O_3$, at alkaline pH, is converted into OH radicals; thus, the risk of not decomposed Ozone occurring, which is reported to degrade metal surfaces, is further minimized at this pH range.

Furthermore, the use of an organic strong base whose molecular dimensions are much bigger compared to Si—O—Si dimension such as Tethramethylammonium Hydroxide (TMAH) could lead to lesser inter-diffusion through the surface material layers.

Figure 7:
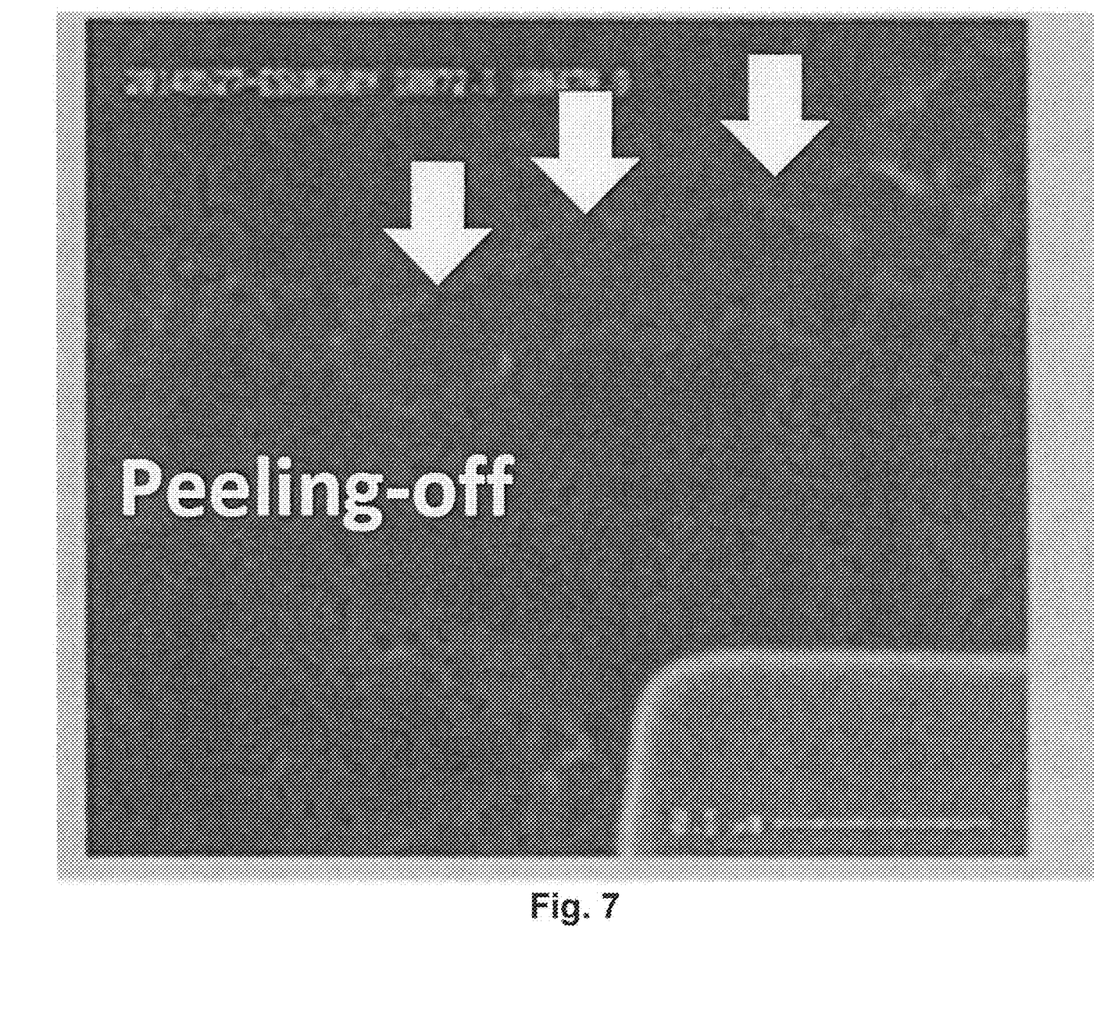
FIG. 7 is an AFM image of an EUV mask having a Ruthenium capping layer after 100× cleaning with DI-$CO_2$ water in combination with UV-radiation.

In FIG. 7 typical damage results obtained in conventional used media such as DI-$CO_2$ are shown. FIG. 7 shows AFM images of a Ruthenium layer of an EUV mask after 100× times clean in slightly acid media such as $CO_2$ water solution (measured pH=5.5). Experiments done in DI-water (pH=6.0) gave similar results.

Figure 8:
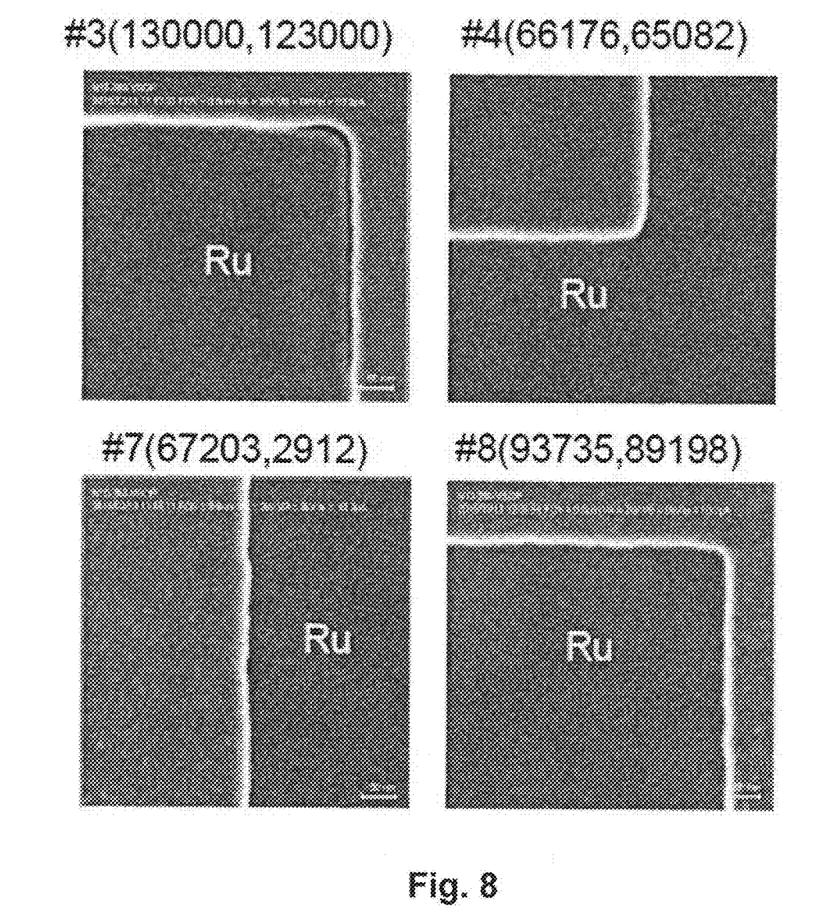
FIG. 8 shows AFM images of an EUV mask having a Ruthenium capping layer after 100× cleaning with TMAH in DI water in combination with UV-radiation.

This same experiments was conducted in a diluted solution of TMAH base; the dilution was such that the final electrical conductance of the solution was about 50 µS and the resulting measured pH was 10.2. Similar AFM images, as shown in FIG. 8 show no damage after 100× times clean.

Thus, it can be shown bow a pH shift to alkaline values positively Impacts surface integrity of EUV photomasks during an In-situ UV strip or final clean.

The above examples show how the use of absorbing media in a non-absorbing media and a shift to alkaline values in an aqueous liquid medium may influence the results in an In-situ UV wet treatment of substrates. In particular the following general parameter set was deduced for an in-situ wet treatment of a substrate from the experimental results performed by the inventors.

| | Parameter | Parameter range | Preferred parameter range |
|---|---|---|---|
| 1 | Absorbing media concentration | 5-100 ppm | 20-60 ppm |
| 2 | Electrical conductance of media | 20-500 µS | 70-150 µS |
| 3 | Media pH | 8-11 | 9.5-10.5 |
| 4 | Media Temperature | 20-70° C. | 20-40° C. |
| 5 | Emission wavelength | 185-600 nm | 185-300 nm or 200-300 nm |
| 6 | UV source Intensity | 25-340 mW/cm² | 35 to 310 mW/cm² depending on the application |
| 7 | Distance between light-source and substrate | 1-5 mm | 1-2 mm |

Not all parameters have to be fulfilled for the different treatments such as surface preparation, strip and final clean. Rathermore, specific parameters are of more relevance than others in the different processes. In each of the processes an increase of the electrical conductance of the liquid medium is beneficial as it allows tailoring the equilibrium of reactive species generated. Furthermore, in the surface conditioning, the absorbing media concentration in the non-absorbing media concentration is important. In particular a low concentration of not more than 20 ppm, preferably not more than 5 ppm should be used. In the resist strip, the absorbing media concentration is again an important parameter. Here also the emission wavelength has been shown to have a significant influence on the result of the process. In the final clean, the pH-value in combination with the electrical conductance is important.

Although the invention was described with respect to the specific application of cleaning a EUV photomask, many of the above principles and also ranges given above will also apply to other substrates, where a high cleanliness of a substrate surface is required.

An important aspect of the invention is that the aqueous liquid medium is irradiated with UV-radiation immediately prior to applying the same to the surface of the substrate. In so doing, the medium will already be decomposed/radical species will be generated prior to application of the liquid to the substrate. Depending on the composition of the medium, a certain equilibrium of the reactive species may be present in the medium at the time of applying the medium on the substrate or in other words, when the medium exits through the outlet slits discussed above. Other factors may play into this equilibrium such as the duration (time) of exposure to the UV-radiation and the intensity of the radiation.

However, the inventors were the first to find out that by adjusting the electrical conductance, where the medium is exposed to UV-radiation prior to applying the same to a substrate to be treated, the equilibrium of reactive species may be shifted and a desired equilibrium may be adjusted. The electrical conductance ranges given indicate low concentrations of the respective additives, which are pushing the equilibrium of active species toward reagents or products. An additional effect may be the stabilization of certain radicals depending on the amount of charge. Such a shift in the equilibrium also occurs with an increase of the pH (to alkaline conditions) as well as a decrease of the pH (to acidic conditions). Both conditions may have certain other beneficial effects. For example, an alkaline medium may protect integrity of a metal layer on a photomask during a strip or final clean process, as discussed above.

For other applications, a shift of the pH to acid conditions may be preferable. For example, a $CO_2$-water clean (which is slightly acidic) in combination with UV-radiation has been demonstrated to be efficient cleaning media for optical photomask. Also, for specific applications in the field aqueous media, acidification of the media could be performed to for example preserve stable passivation oxides, such as Germanium Oxide, which would be damaged in alkaline media, while at the same time providing reactive species for example cleaning purposes. In such cases uses of low absorbing acids would be preferable. Germanium chemistry is widely used in the manufacture of ICs, and the use of an in-situ UV process as described above can be successfully applied to the wafer cleaning as well. Metallic germanium undergoes spontaneous oxidation to $GeO_2$ which acts as protective passivation layer.

With an alkaline medium this would be solubilized into $HGeO_3^-$.

Here, the shift to an acidic media would avoid this solubilization process thus impacting positively the surface integrity.

The invention thus not only considers an adjustment of the electrical conductance to a range of 20 to 2000 µS but also of the pH to the range of 8 to 11 but also an adjustment of the pH to the range of 3 to 6, wherein a substantial shift from neutral is considered to be necessary to achieve a desired shift in the equilibrium of species when the medium is applied to a substrate (for example when it exits through the outlet slits of the device discussed above). Such a shift will also speed up/retard certain reactions caused by the UV-radiation. Other factors which may influence the equilibrium are the intensity of the UV-radiation and the duration of the exposure of the medium to the UV-radiation. Both of these may also be adjusted in accordance with the pH of the media or vice versa. In particular, the duration of exposure may be adjusted via the flow velocity of the medium, although certain minimum and maximum flows may be required for the process. Another option is to change the length (distance) of exposure to UV-radiation within the flow channel, for example by a shading cover, such as the shutters described above.

The invention was described here in above with respect to several embodiments, without being limited to the particular embodiments. In particular, the in-situ UV-wet treatments discussed above may also be used in combination with other substrates. In particular semiconductor wafers. Also, the different features as described and as claimed herein below may be combined in any suitable manner. Therefore, it is intended that the invention not be limited to the particular embodiments disclosed, but that the invention will include all embodiments falling within the scope and spirit of the following claims.

The invention claimed is:

1. A method for treating a EUV mask having an exposed ruthenium layer, comprising:
   flowing an aqueous liquid medium through a flow channel and at least one outlet slit onto a substrate to be treated;
   exposing the aqueous liquid medium to UV-radiation of a specific wavelength at least in a portion of the flow channel immediately adjacent the at least one outlet slit and after the aqueous liquid medium has flown through the outlet opening towards the substrate and thus prior to and while applying the aqueous liquid medium to the surface of the substrate to be treated;
   adjusting the electrical conductance of the aqueous liquid medium to be in the range of 20 to 2000 µS, by the addition of an additive to the aqueous liquid medium, the aqueous liquid medium prior to the addition of the additive having an electrical conductance below 20 µS prior to or while exposing the same to the UV-radiation; and further comprising shifting the pH of the aqueous liquid medium to a range of 8 to 11 by the addition of the additive to the aqueous liquid medium prior to or while exposing the same to the UV-radiation, the aqueous liquid medium prior to the addition of the additive having a pH in the range of 6 to 8, the additive comprising a base.

2. The method of claim 1, wherein the aqueous liquid medium is adjusted to have an electrical conductance in the range of 20 to 500 µS, wherein the additive comprises a base.

3. The method of claim 1, wherein the additive does not substantially change the pH of the aqueous liquid medium.

4. The method of claim 2, wherein the aqueous liquid medium is adjusted to have a pH-value in the range of 9.5 to 10.5 and an electrical conductance in the range of 70 to 150 μS.

5. The method of claim 2, wherein the base is TMAH.

6. The method of claim 2, wherein the base is a non-coordinating compound, which does not have available external electrons capable of establishing a direct bond with a metal on the surface of the substrate.

7. The method of claim 2, wherein the method of treating occurs after a photoresist strip of the substrate.

8. The method of claim 1, wherein the aqueous liquid medium is a mixture of an aqueous liquid medium, which is in substance a non-absorbing medium for the UV-radiation at the specific wavelength, and 5 to 100 ppm of a substantially absorbing medium at the specific wavelength.

9. The method of claim 8, wherein the substantially absorbing medium is the additive for adjusting the electrical conductance.

10. The method of claim 1, comprising the step of adjusting the time the liquid medium is exposed to the UV-radiation in the flow channel before exiting the at least one outlet slit.

11. The method of claim 1, wherein the electrical conductance is adjusted in accordance with the amount of time the aqueous liquid medium is exposed to the UV-radiation within the flow channel before exiting the at least one outlet slit.

12. The method of claim 3, wherein the pH is adjusted in accordance with the amount of time the aqueous liquid medium is exposed to the UV-radiation within the flow channel before exiting the at least one outlet slit.

13. The method of claim 1, further comprising the step of exposing the aqueous liquid medium to UV-radiation of a specific other wavelength as used in the step of exposing the aqueous liquid medium to UV-radiation of a specific wavelength immediately prior to and while applying a film of said aqueous liquid medium to the surface of the substrate to be treated, prior to said step.

14. The method of claim 1, wherein in the step of exposing the aqueous liquid medium to UV-radiation of a specific wavelength immediately prior to and while applying a film of said aqueous liquid medium to the surface of the substrate to be treated, the specific wavelength in the range of 200 to 300 nm.

15. The method of claim 13, wherein the specific other wavelength is below 200 nm.

16. The method of claim 1, wherein the aqueous liquid medium is irradiated with UV-radiation at an intensity of 25 to 340 mW/cm$^2$.

17. The method of claim 1, wherein the distance of a source of UV-radiation and the surface of the substrate to be treated is in the range of 1 to 5 mm.

18. The method of claim 1, wherein the method comprises an adjustment of the surface energy of the substrate, wherein the composition of the aqueous liquid medium is adjusted to have an electrical conductance in the range of 70 to 150 μS, and wherein the aqueous liquid medium is a mixture of an aqueous liquid medium, which is in substance a non-absorbing medium for the UV-radiation at the specific wavelength, and 5 to 10 ppm of a substantially absorbing medium at the specific wavelength.

19. The method of claim 18, wherein the steps of the method are repeated several times on the same substrate, and wherein different absorbing media are used in at least two different repeat cycles.

20. The method of claim 19, wherein at least one absorbing medium is selected from $O_3$ and TMAH.

21. The method of claim 1, wherein the treatment comprises a photo-resist strip from the substrate, wherein the composition of the aqueous liquid medium is adjusted to have an electrical conductance in the range of 20 to 500 μS, and wherein the aqueous liquid medium is a mixture of an aqueous liquid medium, which is in substance a non-absorbing medium for the UV-radiation at the specific wavelength, and 5 to 100 ppm of a substantially absorbing medium at the specific wavelength.

22. The method of claim 21, wherein at least one absorbing medium is selected from the group consisting of $O_3$, $H_2O_2$ and TMAH.

* * * * *